United States Patent
Rochat et al.

(10) Patent No.: US 10,191,452 B2
(45) Date of Patent: Jan. 29, 2019

(54) DEVICE FOR AN ATOMIC CLOCK

(71) Applicant: Orolia Switzerland SA, Neuchatel (CH)

(72) Inventors: Pascal Rochat, Marin (CH); Bernard Leuenberger, Bevaix (CH)

(73) Assignee: Orolia Switzerland SA (CH)

(*) Notice: Subject to any disclaimer, the term of this patent is extended or adjusted under 35 U.S.C. 154(b) by 0 days.

(21) Appl. No.: 15/116,773

(22) PCT Filed: Feb. 6, 2014

(86) PCT No.: PCT/EP2014/052365
§ 371 (c)(1),
(2) Date: Aug. 4, 2016

(87) PCT Pub. No.: WO2015/117660
PCT Pub. Date: Aug. 13, 2015

(65) Prior Publication Data
US 2016/0378065 A1    Dec. 29, 2016

(51) Int. Cl.
*G04F 5/14* (2006.01)
*H03L 7/26* (2006.01)
(Continued)

(52) U.S. Cl.
CPC ............ *G04F 5/14* (2013.01); *G04F 5/145* (2013.01); *H01P 3/127* (2013.01); *H03B 5/1882* (2013.01);
(Continued)

(58) Field of Classification Search
CPC .......... H03K 3/32; H05K 1/18; H05K 1/0212; G04F 5/14; H03L 7/26; H03L 7/08; H03B 5/1882; H01P 3/127
(Continued)

(56) References Cited

U.S. PATENT DOCUMENTS 3,510,758 A * 5/1970 Huggett .................... H03L 7/26
                                                  324/305
5,192,921 A * 3/1993 Chantry .................... G04F 5/14
                                                    331/3
(Continued)

FOREIGN PATENT DOCUMENTS

CN        101055247 A    10/2007
CN        101237077 A     8/2008
(Continued)

OTHER PUBLICATIONS

International Search Report of PCT/EP2014/052365, dated Jan. 1, 2015, 2 pages.
(Continued)

*Primary Examiner* — Arnold Kinkead
(74) *Attorney, Agent, or Firm* — Blank Rome LLP

(57) ABSTRACT

The present invention concerns a device (1) for an atomic clock. The device has a printed circuit board (20), a heating source, and microwave conductor. The printed circuit board (20) includes a conductive piece (10) for both interrogating and heating a gas in a cell of an atomic clock. The piece (10) has a gap (11), and is arranged for containing the cell (2), so as to directly touch the cell (2) in at least one point. The heating source (40, 60) generates heat, and is connected to the piece (10). The microwave conductor (12) is arranged to be connected to the piece (10) so as to send to the piece (10) a microwave signal for interrogating the atoms of the gas in the cell (2). This device performs more than one function (e.g. heating and interrogating) and simplify the manufacturing of the atomic clock.

21 Claims, 6 Drawing Sheets

(51) Int. Cl.
*H03B 5/18* (2006.01)
*H03L 7/08* (2006.01)
*H01P 3/127* (2006.01)
*H05K 1/02* (2006.01)
*H05K 1/18* (2006.01)
*H05K 3/32* (2006.01)

(52) U.S. Cl.
CPC .............. *H03L 7/08* (2013.01); *H03L 7/26* (2013.01); *H05K 1/0212* (2013.01); *H05K 1/18* (2013.01); *H05K 3/32* (2013.01); *H05K 2201/10022* (2013.01); *H05K 2201/10151* (2013.01); *H05K 2201/10166* (2013.01)

(58) Field of Classification Search
USPC ..................................................... 331/3, 94.1
See application file for complete search history.

(56) References Cited

U.S. PATENT DOCUMENTS

| | | | |
|---|---|---|---|
| 5,327,105 A | 7/1994 | Liberman et al. | |
| 6,812,800 B2* | 11/2004 | Matsuura | G04F 5/14 331/3 |
| 2003/0146796 A1 | 8/2003 | Matsuura et al. | |
| 2006/0022761 A1 | 2/2006 | Abeles et al. | |
| 2007/0247241 A1 | 10/2007 | Braun et al. | |
| 2009/0302956 A1 | 12/2009 | Matsuura | |
| 2014/0247094 A1* | 9/2014 | Englund | G01R 33/1284 331/94.1 |

FOREIGN PATENT DOCUMENTS

| | | |
|---|---|---|
| CN | 102799103 A | 11/2012 |
| JP | H0286232 U | 7/1990 |
| JP | H05300016 A | 11/1993 |
| JP | H0653743 A | 2/1994 |
| JP | 2001339302 A | 12/2001 |
| JP | 2003229766 A | 8/2003 |
| JP | 2009302118 A | 12/2009 |
| JP | 2014007300 A | 1/2014 |

OTHER PUBLICATIONS

Japanese Office Action for JP Application No. 2016-550170, dated Dec. 13, 2017, 5 pages.
English-language Translation of CN Office Action for CN Application No. 201480075019.0, dated Jun. 15, 2018, 7 pages.

* cited by examiner

DEVICE FOR AN ATOMIC CLOCK

RELATED APPLICATIONS

This application is a national phase of PCT/EP2014/052365, filed on Feb. 6, 2014, The content of the application is hereby incorporated by reference.

FIELD OF THE INVENTION

The present invention concerns a device for an atomic clock, and an atomic clock comprising this device. The present invention concerns also a method for manufacturing this device for an atomic clock, and a method for manufacturing the atomic clock comprising this device.

DESCRIPTION OF RELATED ART

Communications, localization, aerospace, defence and similar applications require frequency references with high stability and accuracy. Atomic clocks are the most stable and accurate frequency references available, as they exploit an atomic transition of alkali-metal atoms, e.g. the Cesium or the Rubidium atoms, for correcting the output frequency of a local oscillator, so as to improve its stability.

According to the theory of the quantum electronics in fact the electrons of an atom belong to energy states, each state corresponding to a specific, discrete energy level. Differences between the energies of these states define, according to the laws of the quantum electronics, specific frequencies. These frequencies are substantially equal for every atom: this is the reason why atoms are stable and accurate frequency references.

Alkali-metal atoms are used as their ground state comprises two very closely spaced energy levels. This splitting or transition spacing, named "hyperfine structure", generates a really stable and accurate frequency reference.

Alkali-metal atoms are contained as vapour in a cell or package, e.g. made by glass or by silicon. A light source, e.g. a laser source as a vertical cavity surface emitting laser (VCSEL), is directed to the cell. A light sensor, e.g. a photo detector, in line with the light beam is then used to measure the transmission of the light through the cell containing the atoms. A coil around the cell generates a static homogeneous magnetic field (C-field) in the cell.

The alkali-metal atoms, e.g. Cesium atoms, can then be excited or interrogated by a microwave wave propagating in cell. In the context of the present invention, the expression "microwave wave" indicates a wave having a frequency between 1 GHz and 30 GHz, preferably between 3 GHz and 10 GHz.

The microwave wave is produced by a frequency synthesizer, phase-locked to a local oscillator, e.g. a quartz oscillator, producing a frequency that is typically 5 MHz or 10 MHz.

When the microwave frequency is chosen such that it corresponds to the frequency of the ground-state hyperfine splitting of the atoms, a change in the atomic state occurs, which can be detected by the light sensor. This signal is used to tune the local oscillator frequency so as it is kept resonant with the atoms.

An error signal can be generated from the resonance using lock-in detection. The local oscillator can then be locked to the atomic resonance and provides the frequency output of the atomic clock.

In an atomic clock, the cell is heated to about 80° C.: in fact at this temperature, vapour phase atoms in equilibrium with the liquid phase allow relative high density of atoms, and the observation of the atomic resonance is then possible.

In the known atomic clocks, the heating device is a supplementary piece to add to the other pieces which constitute the atomic clock. Then the atomic clock is cumbersome, and its manufacturing can be complex.

U.S. Pat. No. 5,192,921 (Westinghouse) describes in its FIG. 2 a bifilar helix wound around a cell of an atomic clock, which is used for both heating the cell and interrogating its atoms. The described atomic clock is however difficult to manufacture, as it is necessary to hold the cell and wind up the helix around the cell. Moreover the helix must be bifilar, so as to avoid the generation of a longitudinal magnetic field in the cell that can render instable the magnetic field in the cell. Moreover the heating of the cell is not homogenous, as there are zones of the cell that are not surrounded by the bifilar helix.

U.S. Pat. No. 5,192,921 (Westinghouse) describes also in its FIG. 3 the use of a LC gap exciter around the cell. This well-known split ring resonator can be modelled as an LC circuit where the loop is an inductor and the gap is a capacitor. The LC gap exciter is then shaped and dimensioned so that its inductance and capacity constitute a resonant circuit corresponding to the resonance frequency of the cell, so as to exploit the Q factor of the resonance for boosting the amplitude of the microwave signal. The dimensions of the resonator are then predetermined. Moreover a separated heating device is needed for heating the cell.

It is then an aim of the present invention to obviate or mitigate one or more of the aforementioned disadvantages.

It is an aim of the present invention to provide a device for an atomic clock, performing more than one function (e.g. heating and interrogating) and which can simplify the manufacturing of the atomic clock.

BRIEF SUMMARY OF THE INVENTION

According to the invention, these aims are achieved by means of a device for an atomic clock, the device comprising:

a printed circuit board, the printed circuit board comprising a conductive piece for both interrogating and heating a gas in a cell of an atomic clock, the piece comprising a gap, and being arranged so as to contain the cell, and so as to directly touch the cell in at least one point, a heating source for generating heat, said heating source being arranged to be connected to the cell, microwave conductive means arranged to be connected to the piece so as to send to the piece a microwave signal for interrogating the atoms of the gas in the cell.

In such arrangement, the orientation of the magnetic field (H_field) created by this microwave signal has the same direction as the C_field created by the coil.

In the context of the present invention, the expression "printed circuit board" (PCB) indicates a non-conductive substrate on which electronic components are placed. It is arranged so as conductive means, e.g. conductive tracks, pads, etc., can be formed on it, for example by etching. These conductive means connect the electronic components placed on the PCB.

In one preferred embodiment the heating source is an electronic component, e.g. a transistor or a resistor, placed on the printed circuit board. In a first variant, this heating source is connected to the piece of the device by conductive traces on the PCB. As the piece is conductive, surrounds the cell and directly touches the cell in at least one point, it heats the cell. The piece according to invention acts then as a heating device. In a preferred embodiment the thickness of the piece is more than 2 mm: in such a case, the piece exploits its mass for efficiently and homogenously heating the cell. In such a case, the thickness of the piece is not necessarily determined by the resonance frequency, but by its heating function. The heating of the cell by using the piece of the device according to the invention is then more homogeneous than the heating generated by the known bifilar helix.

In a second variant, the heating source is welded on a conductive trace surrounding the cell, as will be discussed.

According to another embodiment, the heating source is a band and/or a wire on the external surface of the piece. This band or the wire are arranged so that a current circulating in the band or wire does not induce a longitudinal magnetic field in the cell. In this embodiment, the heating source is on the piece.

In another embodiment the heating source comprises a bifilar winding on the piece, this bifilar winding comprising a first wire and a second wire, and being arranged to simultaneously conduct a first current in a first direction in the first wire, and a second current of the same value of the first current, in a second direction opposite to the first direction in the second wire, so as to avoid the induction of a magnetic field in the cell.

In one preferred embodiment, the printed circuit board comprises a piece conductive trace arranged around the piece and connected to the piece, so as to connect the piece with other conductive traces on the printed circuit board, e.g. the heating conductive traces, etc. In a preferred embodiment the shape of the piece conductive trace corresponds to the section of the piece. In another preferred embodiment the dimensions of the piece conductive trace are greater than the dimensions of the section of the piece (e.g. if the piece is a hollow cylinder having a circular section and a diameter of 5 mm, the piece conductive trace will be a ring having a diameter larger than 5 mm, e.g. 6 mm). The piece is then placed on the piece conductive trace of the printed circuit board.

In another embodiment, electronic components like the transistor, the resistor, etc., are directly welded on the piece conductive trace.

In a variant, the printed circuit board of the device according to the invention comprises:

a temperature sensor for sensing the temperature of the piece, and sensor conductive traces for connecting the temperature sensor to the piece.

In one preferred embodiment, the temperature sensor is an electronic component as a thermistor, e.g. a negative temperature coefficient (NTC) thermistor or a positive temperature coefficient (PTC) thermistor, placed on the PCB and connected to the piece by conductive traces on the PCB. In a preferred embodiment the sensor conductive traces are connected to the piece via the piece conductive trace.

In a preferred embodiment the piece of the device according to the invention is a hollow cylinder, e.g. a circular or elliptic cylinder. In another embodiment is a hollow prism, e.g. a parallelepiped.

In one embodiment the height of the piece is less than 10 mm, e.g. less than 6 mm, for example 2 mm. In another embodiment the width or diameter of the piece is less than 10 mm, e.g. less than 6 mm, for example 2 mm.

In one embodiment the piece is arranged so that its internal surface has a shape arranged for containing a cell. In one embodiment, the cell has a spherical shape: in such a case, the space or cavity defined by the internal surfaces of the piece will have a spherical shape too.

In another embodiment the PCB's section is a square (n×n) or a rectangle (n×m), wherein n and/or m are comprised between 2 mm and 10 mm.

Is to be understood that the piece of the device according to the invention is not an LC gap exciter, i.e. it does not need to work at the resonance. In fact the frequency of the microwave signal sent to the piece is not necessarily equal to the resonance frequency of the piece, the resonance frequency being defined as 1/(LC), where C is the capacity given by the gap of the piece, and L the inductance of the piece. In other words the shape and the size of the piece are not necessarily pre-determined by the desired resonance frequency, so that the piece's manufacturer has more degrees of freedom available for designating the piece.

The device according to the invention not only heats the cell, but also interrogates the atoms of the gas in the cell. In fact microwave conductive means connect the piece to a microwave signal generator, so as to send to the piece a longitudinal microwave magnetic field signal for interrogating the atoms of the gas in the cell. In one embodiment, the microwave conductive means comprise one or more bonding wires. In another embodiment, the microwave conductive means comprise one or more conductive traces on the PCB of the device according to the invention.

The device according to the invention not only performs both the heating and the interrogating of the atoms in the cell, but it is also easy to manufacture. Is manufacturing comprises the following steps:

placing the piece on the printed circuit board, placing the cell in the piece so that the piece directly touches the cell in at least one point.

The cell can then be fixed, e.g. glued, on the printed circuit board. The piece can be fixed as well, e.g. by gluing or soft soldering, on the printed circuit board.

In a preferred embodiment, the part of the printed circuit board corresponding to the cavity of the piece of the device containing the cell comprises a hole. In fact, as the cell is made in general of a transparent material, i.e. of a material adapted to allow the light to pass through it, the light can pass through the cell and then through the hole of the PCB, towards the light detector. In another embodiment, the part of the printed circuit board corresponding to the cavity of the piece of the device for containing the cell does not contain any hole and it is made of a transparent material.

All elements and electronics components, useful for the working of the device, can be then easily placed on the printed circuit board, e.g. by pick-and-place techniques.

Is to be understood that the expression "placed on the PCB" does not necessarily means "on the PCB surface comprising the piece according to the invention". In fact electronics components, as known, can be placed also on the surface opposite to that containing the piece, and connected to the piece via conductive holes (vias) of the PCB.

Such electronics components can comprise a transistor placed on the printed circuit board and acting as a heating source. Conductive traces on the printed circuit board can connected the piece with the transistor.

Such electronics components can comprise a resistor placed on the printed circuit board and acting as a heating source. In the same way, conductive traces on the printed circuit board can connected the piece with the resistor.

Such electronics components can comprise a temperature sensor for sensing the temperature of the piece, placed on the printed circuit board, and connected to the piece by other conductive traces of the printed circuit board.

Such electronics components can comprise a dedicated integrated circuit integration heating measurement and control module placed on the printed circuit board, and connected to the piece by other conductive traces of the printed circuit board.

The present invention concerns also an atomic clock comprising:
the device according to the invention,
a cell in the piece of the device,
a first printed circuit board comprising a light source, e.g. a VCSEL, for sending a light into the cell,
a second printed circuit board, comprising at least a part of a coil for generating a C-field in the cell,
a third printed circuit board comprising a light sensor for sensing the light generated by the light source and passed through the cell,
a support.

Advantageously the support is conductive, e.g. metallic, and it is arranged so that the PCB of the device according to the invention, the first printed circuit board, the second printed circuit board, and the third printed circuit board are aligned on this support.

In the context of the present invention, the expression "are aligned" indicates that the PCB of the device according to the invention, the first printed circuit board, the second printed circuit board, and the third printed circuit board are arranged in a straight line.

In one preferred embodiment this straight line is horizontal, i.e. substantially paralleled to a planar surface supporting the atomic clock: in such a case the support contains one or more conductive pins per PCB, for creating an electrical and mechanical connection with each PCB. The PCBs are then vertically placed on the support and electrically and mechanically connected with it by the pins. The distance between two consecutive PCB is comprised between 1 mm and 5 mm.

In another embodiment this straight line is vertical, i.e. substantially perpendicular to a planar surface supporting the atomic clock, so that the PCBs are stacked on the support.

In a preferred embodiment all the PCBs of the atomic clock have the same shape and size. Their section can be a square (n×n) or a rectangle (n×m), wherein n and/or m are comprised between 2 mm and 10 mm.

In another preferred embodiment the atomic clock further comprises a cap cooperating with the support and hermetically closing the PCBs on the support.

In one preferred embodiment the section of the support is a rectangle p×q, wherein p is less than 3 cm and q less than 2 cm. In one preferred embodiment the section of the support is a rectangle 2 cm×1 cm.

The light source of the atomic clock according to the invention needs to be heated and maintained to a particular temperature too. According to an independent aspect of the invention, the first printed circuit board comprising a light source, e.g. a VCSEL, for sending a light into the cell, is heated by a conductive source as a transistor placed on this first PCB and connected to the laser via conductive traces or by bonding. The first PCB can comprise a conductive trace on which the laser is placed. The conductive trace can have a shape corresponding to the section of the laser.

The present invention concerns also a method of manufacturing the atomic clock comprising,
placing the device according to the invention on the support,
placing the first printed circuit board on the support,
placing the second printed circuit board on the support,
placing the third printed circuit board on the support the PCB of the device, the first printed circuit board, the second printed circuit board and the third printed circuit board being aligned on this support.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
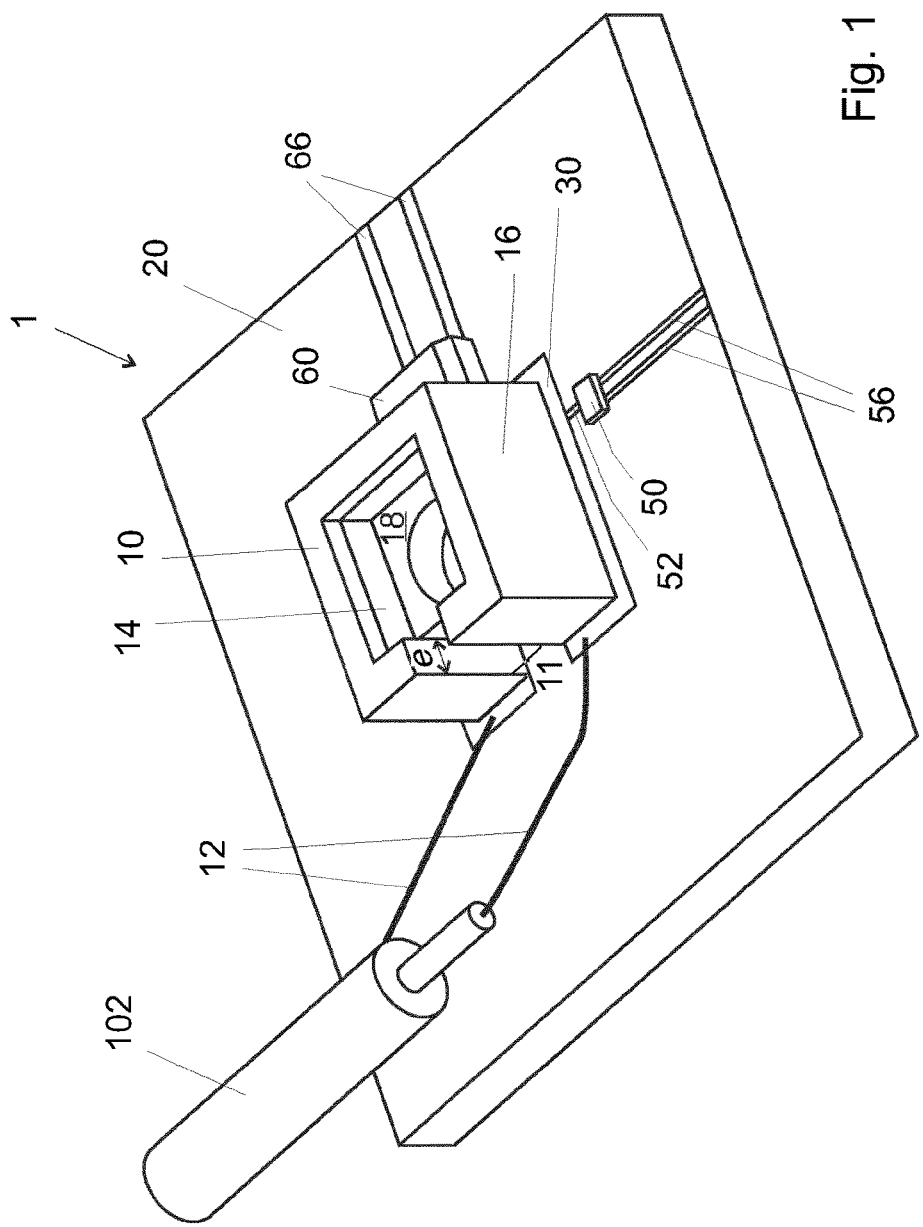
FIG. 1 shows a prospective view of an embodiment of a device according to the invention.

FIG. 1 shows a prospective view of an embodiment of a device 1 according to the invention. It comprises a printed circuit board (PCB) 20, on which is placed a conductive piece 10, made e.g. of Cu, Al, a metallic alloy, etc. The conductive piece 10 in this embodiment is a hollow parallelepiped having a squared section. It comprises a gap 11, which is necessary for avoiding short-circuits. It has a shape designed so that it defines an internal space or cavity 18 arranged to contain a cell (not represented), and to directly touch the cell in at least one point. In a preferred embodiment all the internal surface 14 of the piece 10 touches the cell.

It must be understood that the dimensions and/or proportions of the different elements illustrated in the Figures are approximate, and they do not necessarily correspond to the real dimensions and/or proportions of these elements. For example the surface of the PCB 20 can be less than the surface represented in FIGS. 1 to 3. In one preferred embodiment, the diameter or the width of the piece 10 is about half of the length of the side of a squared PCB 20.

Advantageously the conductive piece 10 allows to both interrogate and heat a gas in the cell.

In fact the device according to the invention comprises a heating source 60 for generating heat, and connected to the piece. In the illustrated embodiment, the heating source is a transistor 60 placed on the PCB 20, powered by conductive traces 66 on the PCB 60 and connected to the piece 10.

Figure 2:
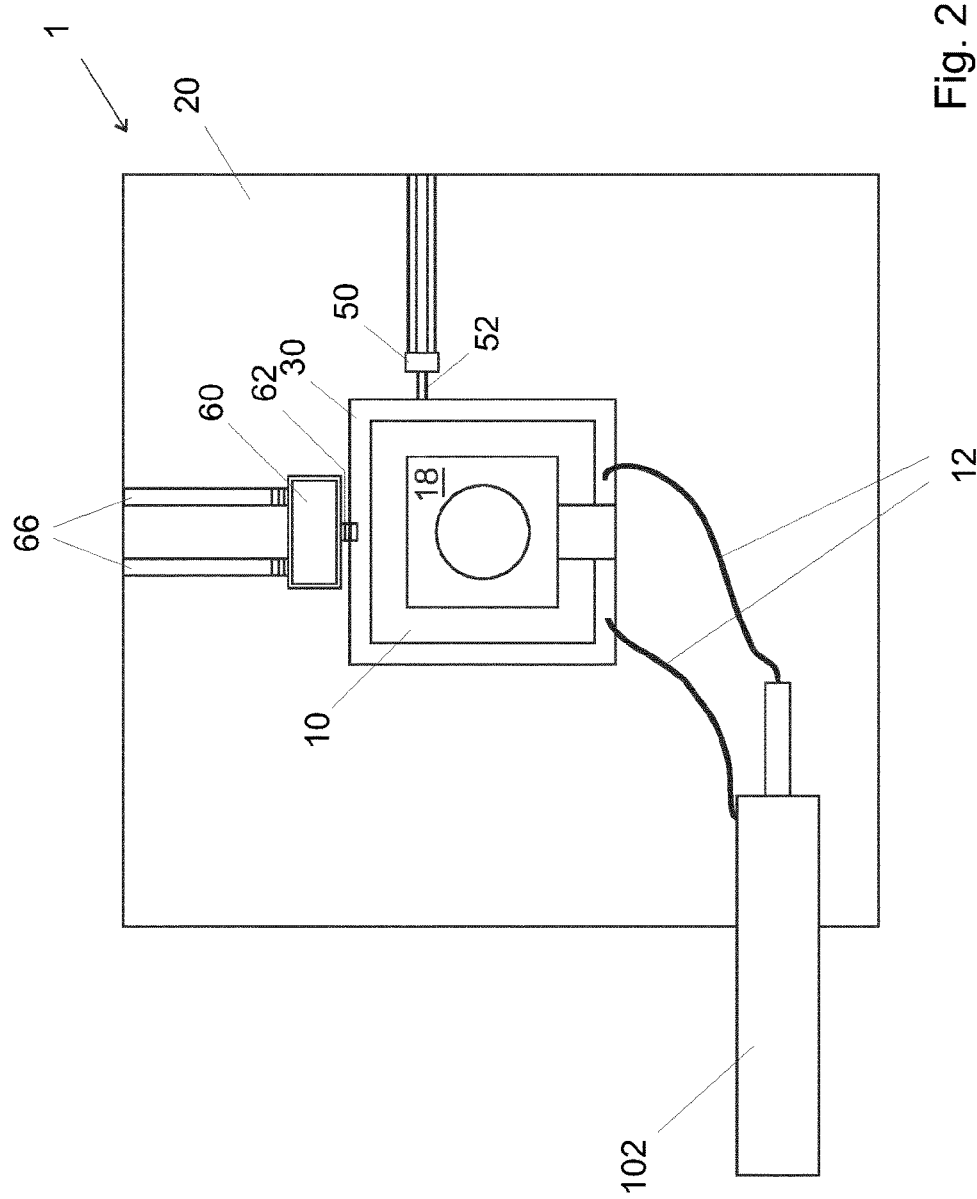
FIG. 2 shows a top view of the device of FIG. 1.

As illustrated in FIG. 2, the piece 10 is placed on a piece conductive trace 30 of the PCB having a section corresponding to the section of the piece 10, a square in this example. The transistor 60 is directly welded on this piece conductive trace 30. Then, when the transistor is powered, the generated heat (some mW) is transferred to the cell in the piece 10 via the piece conductive trace 30 and the conductive piece 10.

In fact, as the piece 10 is conductive, surrounds the cell and directly touches the cell in at least one point, it heats the cell. The piece 10 according to invention acts then as a heating device.

In a preferred embodiment the thickness of the piece e, visible in FIG. 1, is more than 1 mm: in such a case, the piece 10 exploits its mass for efficiently and homogenously heating the cell. In other words, the thickness of the piece is not necessarily determined by the resonance frequency, but by its heating function. The heating of the cell by using the piece 10 of the device according to the invention is then more homogeneous than the heating generated by the known bifilar helix.

In another (not illustrated) variant, the transistor 60 is not directly welded on the conductive trace 30, but is connected to the piece 10, in particular to its conductive trace 30, via dedicated conductive traces.

It is to be understood that the transistor 60 can be replaced by any other electronic component able to generate heat when powered, and arranged to be placed on a PCB as, for example, a resistor.

In the variant of FIGS. 1 and 2, the printed circuit board 20 of the device according to the invention comprises:
a temperature sensor 50 for sensing the temperature of the piece 10, and
at least one sensor conductive trace 52 for connecting the temperature sensor 50 to the piece 10.

The temperature sensor 50 is powered by conductive traces 56 on the PCB 20.

In a variant the temperature sensor 50 can be directly welded on the piece conductive trace 30, as for the heating source 60.

In the illustrated embodiment, the temperature sensor 50 is a negative temperature coefficient (NTC) thermistor placed on the PCB 20. A positive temperature coefficient (PTC) thermistor could be used as well.

The bonding wires 12 in FIGS. 1 and 2 are microwave conductive means 12 arranged to connected the piece 10 to a microwave source (not illustrated) so as to send to the piece 10 a microwave signal for interrogating the atoms of the gas in the cell. In the illustrated embodiment the microwave conductive means 12 are connected to a pin 102, which is connected to a microwave source, as will be discussed.

Is to be understood that the piece 10 is not necessarily an LC gap exciter, i.e. it does not need to work at the resonance. In fact the frequency of the microwave signal sent to the piece 10 via the microwave conductive means 12 is not necessarily equal to the resonance frequency of the piece 10, the resonance frequency being defined as 1/(LC), where C is the capacity given by the gap of the piece, and L the inductance of the piece. In other words the shape and the size of the piece 10 are not necessarily pre-determined by the desired resonance frequency, so that the piece's manufacturer has more degrees of freedom available for designating the piece 10.

In the embodiment of FIGS. 1 and 2, the piece 10 is arranged so that its internal surface 14 has a shape arranged for containing a cell. In other words, the space or cavity 18 defined by the internal surfaces 14 of the piece 10 corresponds to the shape of the cell.

Figure 3:
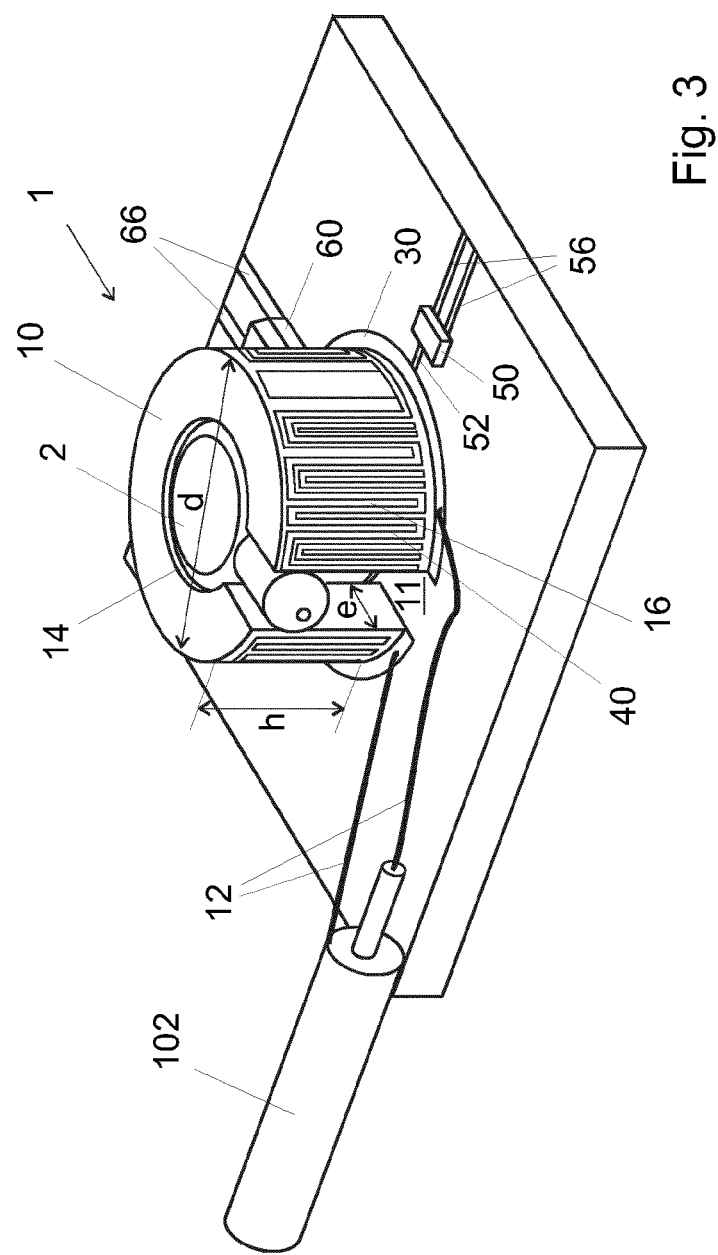
FIG. 3 shows a prospective view of another embodiment of a device according to the invention.

FIG. 3 shows a prospective view of another embodiment of a device 1 according to the invention. In such a case the conductive piece 10 is a hollow cylinder having a circular section of diameter d. Moreover in this embodiment, the heating source is a band and/or a wire 40 on the external surface 16 of the piece 10. This band or the wire 40 are arranged so that a current circulating in the band or wire induce a total magnetic field in the cell which is null.

In another embodiment (not illustrated) the heating source comprises a bifilar winding on the piece, this bifilar winding being arranged so as to avoid the induction of a magnetic field in the cell. In particular the bifilar winding comprises a first wire and a second wire, and is arranged to simultaneously conduct a first current in a first direction in the first wire, and a second current of the same value of the first current, in a second direction opposite to the first direction in the second wire. The first and second currents, having the same value but opposite directions, vary as a function of the temperature.

In another embodiment (not illustrated), one of the first or second wire of the bifilar winding is arranged so as to conduct also a third current, having a value less than the value of the first and second currents, this third current being used for generating the C-field in the cell. By stabilizing electronically this third current, it is possible to get a stable magnetic field in case of heating current changes due to temperature changes.

In a preferred embodiment the piece of the device according to the invention is a hollow cylinder, e.g. a circular or elliptic cylinder. In another embodiment is a hollow prism, e.g. a parallelepiped.

The height h of the piece 10, visible in FIG. 3, is less than 10 mm, e.g. less than 6 mm, for example 2 mm. In another embodiment the width or diameter d of the piece 10 is less than 10 mm, e.g. less than 6 mm, for example 2 mm.

In another embodiment the PCB's section is a square (n×n) or a rectangle (n×m), wherein n and/or m are comprised between 5 mm and 10 mm.

Advantageously the device 1 according to the invention is easy to manufacture. The steps of its manufacturing comprise:
placing the piece 10 on the printed circuit board 20,
placing the cell in the piece, i.e. in its space or cavity 18, so that the piece 10 directly touches the cell in at least one point.

The placing of the piece 10 on the printed circuit board 20 can be performed manually (e.g. by hand) or automatically (e.g. by pick and place).

The cell can be fixed, e.g. glued, on the printed circuit board 20. The piece 10 can be fixed as well, e.g. by gluing, on the printed circuit board 20.

The electronics components as the transistor or resister 60, the thermistor 50, etc. can be easily placed on the printed circuit board 20, e.g. by pick-and-place techniques.

In a preferred embodiment, the piece 10 is placed together with other electronics components (e.g. the transistor 60 and/or the temperature sensor 50) on the PCB 20, e.g. by pick and place. After this placing, the device 1 is heated so as to weld the piece 10 and the electronics components on the PCB 20. After this heating, the cell 2 is placed on the piece 10 and then fixed to the piece 10 and/or to the PCB 20, e.g. by gluing.

Figure 4:
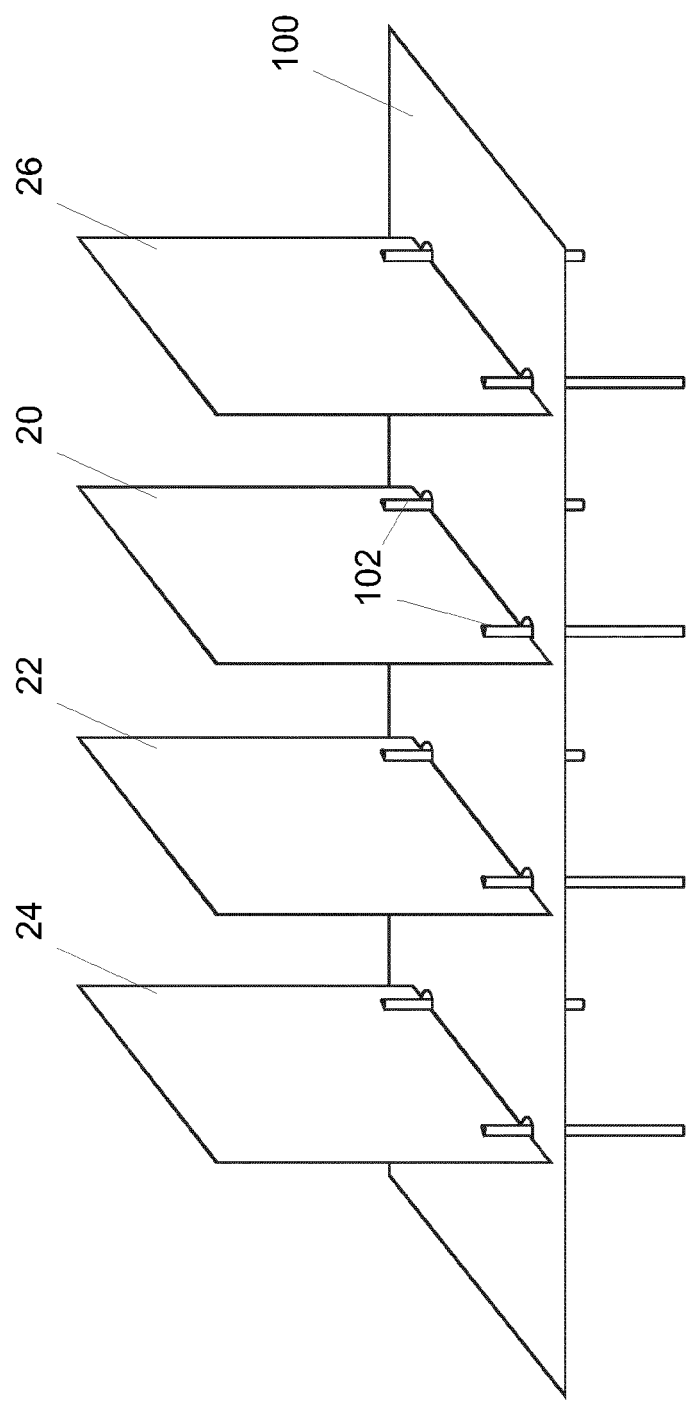
FIG. 4 shows a perspective view of an embodiment of an atomic clock according to the invention.

FIG. 4 shows a perspective view of an embodiment of an atomic clock according to the invention. It comprises:
the device according to the invention (schematically represented only by its PCB 20),
a first printed circuit board 24 comprising a light source (not illustrated), e.g. a VCSEL, for sending a light into the cell,
a second printed circuit board 22, comprising at least a part of a coil (not illustrated) for generating a C-field in the cell, a third printed circuit board 26 comprising a light sensor (not illustrated) for sensing the light generated by the light source and passed through the cell, a support 100.

Advantageously the support 100 is conductive, e.g. metallic, and is arranged so that the PCBs 20, 22, 24 and 26 are aligned on this support 100, i.e. they are arranged in a straight line.

In another embodiment, the atomic clock comprises another PCB (not illustrated) on the support 100, this PCB being placed between the first printed circuit board 24 comprising a light source and the PCB 20 comprising a light attenuator, so as to attenuate the light from the light source before send it to the cell 2 of the PCB 20. In one preferred embodiment, this light attenuator is partially transparent, i.e. it allows the passage only of a part of the received light.

Figure 5:
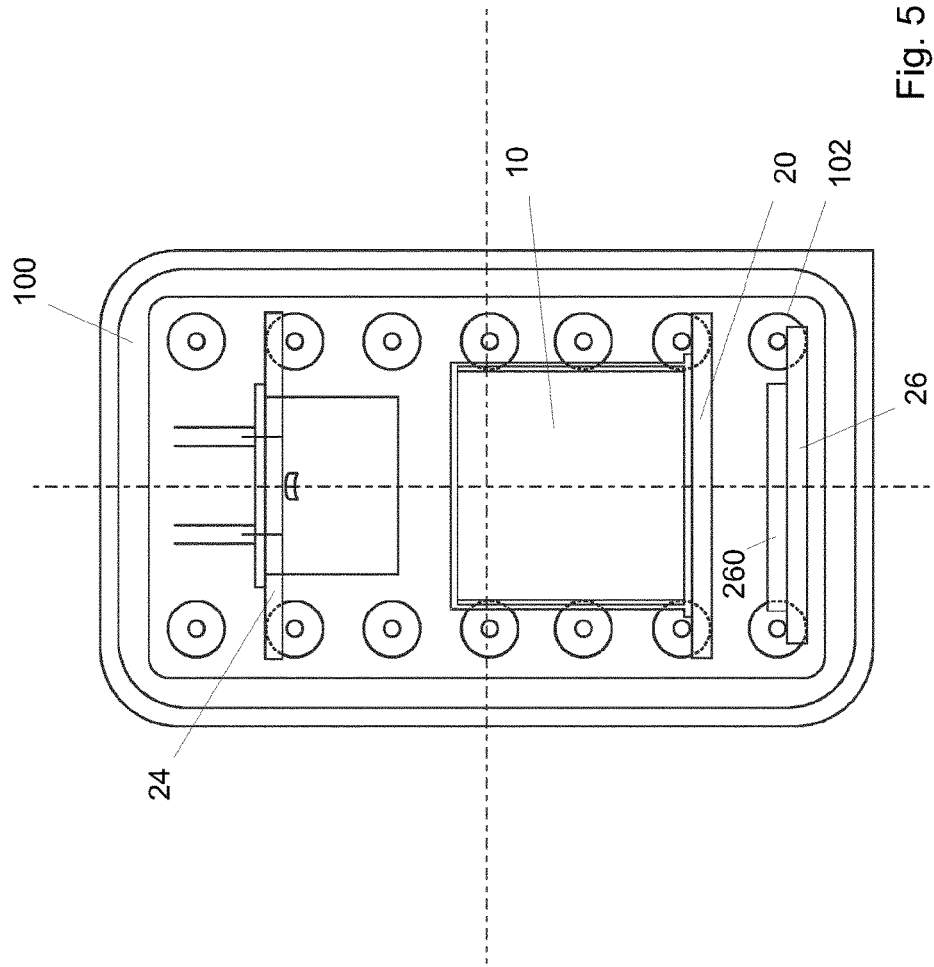
FIG. 5 shows a top view of another embodiment of an atomic clock according to the invention.

In the embodiment of FIGS. 4 and 5, this straight line is horizontal, i.e. substantially paralleled to a planar surface supporting the atomic clock: in such a case the support contains at least two conductive pins 102 per PCB, for creating an electrical and mechanical connection with each PCB. The PCBs are then vertically placed on the support and electrically and mechanically connected with it by the pins. The distance between two consecutive PCB is comprised between 1 mm and 5 mm, preferably 2 mm.

In another embodiment (not illustrated) this straight line is vertical, i.e. substantially perpendicular to a planar surface supporting the atomic clock, so that the PCBs are stacked on the support.

In a preferred embodiment all the PCB have the same shape and size. Their section can be a square (n×n) or a rectangle (n×m), wherein n and/or m are comprised between 2 mm and 10 mm.

In another preferred embodiment the atomic clock further comprises a cap (not illustrated cooperating with the support 100 and hermetically closing the PCBs 20, 22, 24 and 16 on the support 100.

In one preferred embodiment the section of the support 100, visible on FIG. 5, is a rectangle p×q, wherein p is less than 3 cm and q less than 2 cm. In one preferred embodiment p is 2 cm and q is 1 cm.

FIG. 5 shows a top view of another embodiment of an atomic clock 1000 according to the invention. In the illustrated embodiment are visible 14 pins 102, but of course any other number of pins can be used.

The pins 102 can conduct at least some of the following signals:
laser driving signal
laser heating signal
laser temperature signal
laser temperature sensor signal
first C-field signal
second C-field signal
piece temperature signal
piece heating signal
piece temperature sensor signal
first photodiode signal
second photodiode signal
microwave signal
ground.

Figure 6:
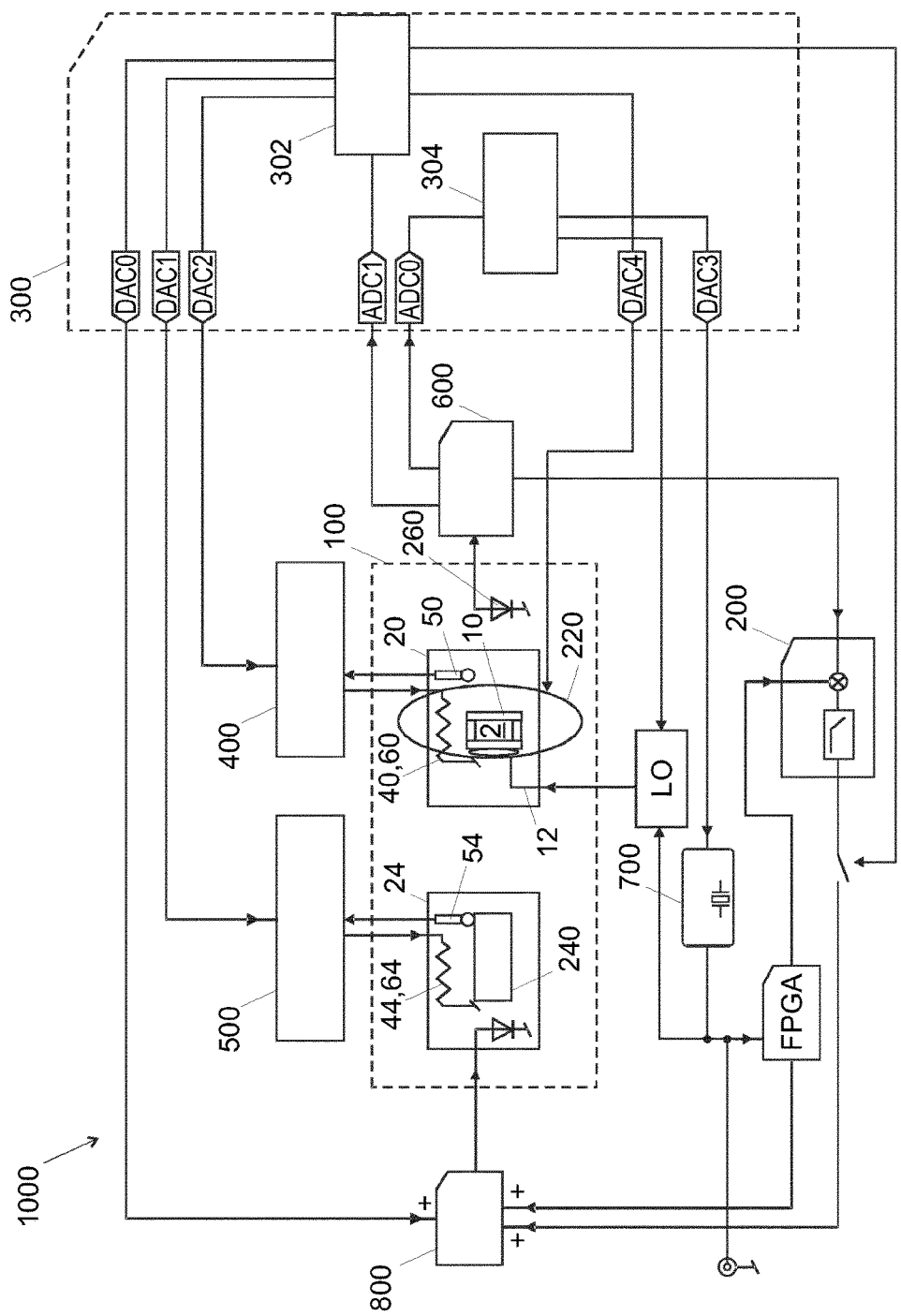
FIG. 6 shows a schematic view of another embodiment of an atomic clock according to the invention.

FIG. 6 shows a schematic view of an atomic clock 1000, comprising the support 100, a light detection module 200, a microcontroller 300, a cell temperature regulation module 400, a light source temperature regulation module 500, a lock-in module 600, a quartz oscillator 700 (e.g. a VCTCXO), a FPGA and a local oscillator (LO).

In the illustrated atomic clock, the light of the light source (laser) can be modulated, e.g. by modulating the current of the laser drive module 800.

The support 100 comprises the first PCB 24, comprising the light source 240, e.g. a VCSEL, a temperature sensor 54 and a heating source 64.

The first PCB 24 is arranged so has to receive a signal from the laser drive module 800, and so as to have a bidirectional communication with the VCSEL temperature regulation module 500.

According to an independent aspect of the invention, the heating source 64 of the laser 240 is a transistor or a resistor placed on the PCB 24 and connected to the laser 240 via conductive traces on the PCB 24 or by bonding. The PCB 24 can comprise a conductive trace on which the laser 240 is placed. The conductive trace can have a shape corresponding to the section of the laser.

The PCB 20 comprises the piece 10 according to the invention, and containing the cell 2, a heating source 40, 60 and a temperature sensor 50. A schematically represented coil 220 is arranged for generating a C-field in the cell 2.

The PCB 20 is arranged so has to receive a signal from the LO module 800 via the microwave conductive means, and so as to have a bidirectional communication with the cell temperature regulation module 400.

A control interface 302 in the microcontroller 300 sends a C-field signal to the coil 220.

A light detector 260 detects the lights from the cell 2, and sends a signal to the light detection module 200. The light detection module 200 sends then a light intensity signal and a modulation signal to the microcontroller 300. The light detection module 200 communicates also a signal to the lock-in module 600, in a known way.

The microcontroller 300 comprises a frequency loop module 304, cooperating with the LO and with the quartz oscillator 700 in a known way.

The present invention concerns also a method of manufacturing the atomic clock comprising, placing the device 1 according to the invention on the support 100, placing the first printed circuit board 24 on the support 100, placing the second printed circuit board 22 on the support 100, placing the third printed circuit board 26 on the support 100, the PCB 20 of the device, the first printed circuit board 24, the second printed circuit board 22 and the third printed circuit board 26 being aligned on this support 100.

The manufacturing of the atomic clock is then simpler and faster than the known solutions.

In a preferred embodiment, the microcontroller 300 and/or the cell temperature regulation 400 and/or the light source temperature regulation 500 and/or the FPGA and/or the LO and/or the lock-in module 200 and/or the light detection module 600 and/or the quartz oscillator 700 and/or the laser drive module 800 can be placed as electronics components (integrated circuits) on a main PCB (not illustrated) placed underneath the support 100 illustrated in FIG. 4. In such a case the pins 102 can be welded on this main PCB.

In other words, in this embodiment the support 100 and the cap cooperating with the support 100 and hermetically closing the PCBs 20, 22, 24 and 16 on the support 100, comprises the physic part of the atomic clock, and the electronic part of the atomic clock is placed under this physic part on the main PCB. The connection between the physic part and the electronic part is performed by the pins 102.

The cap closes the PCBs 20, 22, 24 and 16, i.e. the physic part of the atomic clock, on the support 100 in a sealed way, so that the vacuum can be created inside, or it is possible to fill it with some gas having weak thermal conductivity.

In such a variant then the pins 102 of the support 100 are arranged for connecting the first printed circuit board 24 and/or the second printed circuit board 22 and/or the third printed circuit board 26 on the support 100. They are arranged also for connecting the first printed circuit board 24 and/or the second printed circuit board 22 and/or the third printed circuit board 26 with the main printed circuit board.

The method of manufacturing an atomic clock according to the invention, can then further comprise the following steps:

placing the microcontroller 300 and/or the cell temperature regulation 400 and/or the light source temperature regulation 500 and/or the FPGA and/or the LO and/or the lock-in module 200 and/or the light detection module 600 and/or the quartz oscillator 700 and/or the laser drive module 800 on the main printed circuit board;

placing the main printed circuit board under the support 100;

connecting the first printed circuit board 24 and/or the second printed circuit board 22 and/or the third printed circuit board 26 with the main printed circuit board by using the pins 102 of the support 100.

REFERENCE NUMBERS USED IN THE FIGURES

1 Device
2 Cell
10 Piece
12 Microwave conductive means
14 Internal surface of the piece
16 External surface of the piece
18 Space
20 PCB of the device
22 Second PCB
24 First PCB
26 Third PCB
30 Piece conductive trace
40 Heating source (wire/band) (piece)
50 Temperature sensor (piece)
52 Sensor conductive traces
54 Temperature sensor (laser)
60 Heating source (transistor/resistor) (piece)
62 Heating conductive traces/welding
64 Heating source (laser)
56, 66 Conductive traces
100 Support
102 Pin
200 Lock-in module
220 Coil
240 Light source (VCSEL)
260 Light sensor
300 Microcontroller
302 Control interface module
304 Frequency lock loop module
400 Cell temperature regulation
500 Light source temperature regulation
600 Light detection module
700 Quartz oscillator (VCTCXO)
800 Laser drive module
1000 Atomic clock
e Thickness of the piece
h Height of the piece
d Diameter of the piece
LO Local Oscillator
FPGA Field-Programmable Gate Array
DAC Digital to Analog Converter
ADC Analog to Digital Converter

The invention claimed is:

1. A device for an atomic clock, the device comprising:
a printed circuit board, said printed circuit board comprising a conductive piece for both interrogating and heating a gas in a cell of an atomic clock, the piece being a hollow cylinder or a hollow prism, the piece comprising a gap, and being arranged for containing the cell, and so as to directly touch the cell in at least one point,
a heating source for generating heat, and arranged to be connected to the piece,
microwave conductive means arranged to be connected to the piece so as to send to the piece a microwave signal for interrogating the atoms of the gas in the cell,
wherein the printed circuit board comprises:
a conductive piece trace arranged around the piece so as to connect the piece with at least one other conductive trace of the printed circuit board.

2. The device of claim 1, the printed circuit board comprising
said heating source, and
heating conductive means for connecting the heating source with the piece.

3. The device of claim 2, said heating source being a transistor and/or a resistor.

4. The device of claim 2, said heating conductive means comprising at least one heating conductive trace.

5. The device of claim 1, said heating source being a band and/or a wire on the piece.

6. The device of claim 1, wherein the conductive piece trace has a shape corresponding to the section of the piece.

7. The device of claim 1, the primed circuit board comprising:
a temperature sensor for sensing the temperature of the piece, and
at least one sensor conductive trace for connecting the temperature sensor to the piece.

8. The device of claim 1, the piece being a circular or elliptic cylinder, or a parallelepiped.

9. The device of claim 1, the height of the piece being less than 10 mm, and/or the width or diameter of the device being less than 10 mm.

10. The device of claim 1, the frequency of the microwave signal being different from the resonance frequency of the piece, the resonance frequency being defined as $1/(LC)$, where C is the capacity given by the gap of the piece, and L the inductance of the piece.

11. A method of manufacturing the device according to claim 1, comprising:
placing the piece on a printed circuit board,
placing a cell in the piece so that the piece directly touches the cell in at least one point,
connecting a heating source to the piece,
connecting microwave conductive means to the piece,
wherein the printed circuit board comprises a conductive piece trace arranged around the piece so as to connect the piece with at least one other conductive trace of the printed circuit board.

12. The method of the claim 11, further comprising:
placing a heating source on the printed circuit board,
connecting said heating source to the piece via at east one conductive trace on the printed circuit board.

13. The method of claim 11, further comprising:
placing a temperature sensor for sensing the temperature of the piece on the printed circuit board,
connecting the temperature sensor with the piece via at least one sensor conductive trace on the printed circuit board.

14. An atomic clock comprising:
the device according to claim 1,
a cell in the piece of the device,
a first printed circuit board comprising a light source for sending a light into the cell,
a second printed circuit board, comprising at least a part of a coil for generating a C-field in the cell,
a third printed circuit board, comprising a light sensor,
a support,
the printed circuit board of the device, the first printed circuit board the second printed circuit hoard, the third printed circuit board being aligned on said support.

15. The atomic clock of the claim 14, further comprising a cap cooperating with said support.

16. The atomic clock of claim 14, further comprising a fourth printed circuit board arranged to be placed under the support, and to contain a microcontroller and a cell temperature regulation and a light source temperature regulation and a FPGA and a LO and a lock-in module and a light detection module and a quartz oscillator and a laser drive module.

17. The atomic clock of claim 16, the support comprising at least one pin arranged for connecting the first printed circuit board and/or the second printed circuit board and/or the third printed circuit hoard on the support.

18. The atomic clock of claim 17, the at least one pin being arranged for connecting the first printed circuit board and/or the second printed circuit board and/or the third printed circuit board with said fourth printed circuit board.

19. A method of manufacturing the atomic clock claim 14, comprising,
placing the device on the support,
placing the first printed circuit board on the support,
placing the second printed circuit board on the support,
placing the third printed circuit board on the support,
the printed circuit board of the device, the first printed circuit board, the second printed circuit board, the third printed circuit board being aligned on said support.

20. The method of the claim 19, further comprising
losing the atomic clock by a cap cooperating with said support.

21. The method of the claim 19, further comprising:
placing the microcontroller and/or the cell temperature regulation and/or the light source temperature regulation and/or the FPGA and/or the LO and/or the lock-in module and/or the light detection module and/or the quartz oscillator and/or the laser drive module on a fourth printed circuit board;
placing said fourth printed circuit board under the support;
connecting the first printed circuit board and/or the second printed circuit board and/or the third printed circuit board with said fourth printed circuit hoard by using the pins of the support.

* * * * *